United States Patent

Tran et al.

[11] Patent Number: 5,981,143
[45] Date of Patent: Nov. 9, 1999

[54] CHEMICALLY TREATED PHOTORESIST FOR WITHSTANDING ION BOMBARDED PROCESSING

[75] Inventors: Dean Tran, Westminster; William L. Jones, Inglewood; Harvey N. Rogers, Playa del Rey, all of Calif.

[73] Assignee: TRW Inc., Redondo Beach, Calif.

[21] Appl. No.: 08/978,735

[22] Filed: Nov. 26, 1997

[51] Int. Cl.⁶ .............................. G03C 1/73; G03F 7/075
[52] U.S. Cl. ..................... 430/270.1; 556/410; 556/420
[58] Field of Search .................. 430/270.1; 556/410, 556/420

[56] References Cited

U.S. PATENT DOCUMENTS

| | | |
|---|---|---|
| 4,497,891 | 2/1985 | Kaplan et al. ........................... 430/296 |
| 4,689,289 | 8/1987 | Crivello ................................... 430/270 |
| 5,091,290 | 2/1992 | Rolfson ................................... 430/327 |
| 5,370,908 | 12/1994 | O'Connor et al. .................... 427/385.5 |
| 5,688,634 | 11/1997 | Mixon et al. ........................... 430/296 |
| 5,741,629 | 4/1998 | Chandross et al. ..................... 430/326 |

Primary Examiner—Janet Baxter
Assistant Examiner—Sin J. Lee
Attorney, Agent, or Firm—Michael S. Yatsko

[57] ABSTRACT

A photosensitive photoresist material which is effective for use as an ion etch barrier layer after patterning. The photoresist composition includes the reaction product of a compound having the general formula $R_1$—COO—$(CH_2)_n$—O—$R_2$ and a silylating agent.

4 Claims, 2 Drawing Sheets

■ InP   ■ AZ4620   ▪ Photoresist/HMDS

CHEMICALLY TREATED PHOTORESIST FOR WITHSTANDING ION BOMBARDED PROCESSING

BACKGROUND OF THE INVENTION

1. Field of Invention

The present invention relates to photoresist materials which can be used as an ion etch barrier without additional processing steps.

2. Description of the Prior Art

The manufacture of integrated circuits requires an accurate and precise method to form patterns on wafers to delineate areas for subsequent doping, isolation, interconnections, and the like. Photolithography is generally used to pattern a semiconductor wafer. In conventional positive photolithographic patterning, a photoresist material is spun onto a semiconductor surface and then exposed through a patterned mask to an appropriate radiation, such as ultraviolet light, electron beam, X-ray or the like. The mask allows light or radiation to strike the photoresist only where the pattern is to be formed, thus exposing the resist corresponding to the pattern. The wafer is then developed for example, by subjecting the wafer to an organic-based wash to develop and remove the exposed resist.

Another commonly used photolithography technique makes use of a negative resist process. Negative resist processes allow the exposed photoresist compound to remain on the workpiece after developing. One such negative resist method is diffusion-enhanced silylating resist (DESIRE). The DESIRE process uses photoactive compound (PAC) which is mixed into the photoresist to form barriers to a reactive ion etch.

Photoresist materials are widely used in the semiconductor industry. The photoresist material is easily patterned by a mask and developed. The pattern created can then be created on an underlying substrate by etching. As a result, much effort has been made in using a reactive ion etch (RIE) barrier in combination with photoresists and in chemically or physically altering a photoresist after patterning so that it will have the qualities of an RIE barrier.

U.S. Pat. Nos. 5,094,936, 5,041,362, 5,286,607 and 5,356,758 are examples of multiple step processes used to render photoresist layers resistant to reactive ion etching. In these processes, a photoresist material is applied to a substrate, exposed to a light source, and then subjected to a conversion treatment with a silicon-liberating compound such as hexamethyldisilazane, usually in a gaseous state. These multiple step process result in increased processing difficulty time and expense.

Attempts have been made to provide a photoresist material that can be used as an ion etch barrier. For example, U.S. Pat. No. 5,262,273 describes a photoresist material that is the reaction product of a novolac resist and a substituted silane compound. Further, U.S. Pat. No. 4,665,006 describes a polyamine system having organopolysiloxane segments sensitized by an onium salt.

None of the photoresist composition or processes described previously are effective in the dry etching of deep via holes (remove from 50 microns to 100 microns of semiconductor materials such as InP and related materials) for backside grounding connection by means of ECR (Electron Cyclotron Resonance Radio Frequency Discharges) etching technology. The silylated photoresists described thus far are too thin and erode shortly after removal by a few microns of semiconductor material (InP) under ECR etching conditions. The photoresist materials will crack if they are intentionally coated too thickly.

SUMMARY OF THE INVENTION

It is an object of the present invention to provide a photoresist material which can be used as an ion etch barrier without additional processing steps.

It is another object of the invention to provide a low cost method of patterning substrates which eliminate the requirement of applying a separate ion etch barrier or conversion treatment of a photoresist layer.

It is yet another object of the invention to provide a photoresist which can be utilized at a thickness effective for withstanding the extreme physical condition of high temperature and high ion bombardment of oxygen, hydrogen and halide ions in a low vacuum chamber (ECR etch conditions).

It is another object of the invention to provide a photoresist material that is easily removed by an oxygen plasma or solvent or alkaline and which provide a high rate of selectively etching ratio between the semiconductor material and the photoresist in extreme hard physical etching conditions such as ECR, RIE, ICP etc.

Briefly, the present invention is directed to a photosensitive material which is effective for use as an ion etch barrier layer after patterning. The photoresist composition includes the reaction product of a compound having the general formula $R_1$—COO—$(CH_2)_n$—O—$R_2$, where $R_1$ and $R_2$ are organic radicals having about 1 to about 5 C atoms and n is 2 to 18, and a silylating agent. In an important aspect of the invention, the photoresist composition is effective for use as an ion etch barrier without the need for further processing steps. The photoresist material of the invention is easily removed after etching and provides a selectively etching ratio between the semiconductor material and photoresist of about 6.5:1 to about 11:1.

In another important aspect of the invention, the present invention provides a method for patterning a photoresist layer. The method comprises formulating a photoresist composition comprising a compound of the general formula $R_1$—COO—$(CH_2)_n$—O—$R_2$, where $R_1$ and $R_2$ are organic radicals having about 1 to about 5 C atoms and n is 2 to 18, and a silylating agent. A semiconductor surface of a workpiece is coated with the photoresist composition to form a photoresist layer and the workpiece is air dried at a time and temperature effective for initiating a reaction between the compound of the general formula and the silylating agent. In the next step of the process, the photoresist layer is selectively exposed to a radiation source to form exposed areas and the photoresist layer is removed from the exposed areas to form a positive image in the photoresist layer on the semiconductor surface. The workpiece is then exposed to an ion etch process as known in the art. In an important aspect of the invention, the photoresist composition is not eroded by the etching process, and areas of the workpiece coated with the photoresist are not eroded by the ion etching process.

BRIEF DESCRIPTION OF THE DRAWINGS

These and other objects of the present invention will be readily understood with reference to the following specification and attached drawing, wherein.

DETAILED DESCRIPTION OF THE INVENTION

Figures 1A, 1B, 1C, 1D:
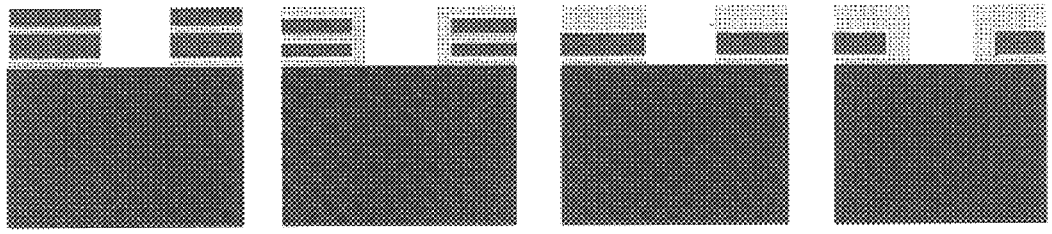
FIG. 1 illustrates the composition of the invention coated on an InP wafer

In accordance with the present invention, the photoresist composition is useful for coating the surface of a substrate. The substrate may be a semiconductor wafer or workpiece during any stage of processing requiring a lithography step. The substrate therefore may contain implanted active and passive devices, devices formed on the semiconductor, one or more conductive layers and one or more insulating layers.

In an important aspect of the invention, a photoresist layer is formulated by mixing a compound of having the general formula $R_1$—COO—$(CH_2)_n$—O—$R_2$, where $R_1$ and $R_2$ are organic radicals having about 1 to about 5 C atoms and n is 2 to 18, with a silylating agent. Examples of compounds having the gen eral formula include 2-ethoxyethylacetate. Other compounds that may be used in the photoresist layer include n butyl acetate. The photoresist may be prepared in solvent such as xylene. As used herein, "silylating agent" refers to compounds that include disilazanes such as hexamethyldisilazane (HMDS), heptamethyldisilazane, and hexaphenyldisilazanes, and compounds such as methyl ethyl siloxane. In an important aspect of the invention the formulation contains about 99.9 weight percent of a compound of the general formula, based on the weight of the formulation, and about 0.1 weight percent silylating agent, based on the weight of the formulation. In another aspect of the invention, the formulation has a ratio of the compound of the general formula to the silylating agent of about 99.9:0.1 to about 95:5.

The photoresist layer is spun onto the workpiece by methods known in the art. In an important aspect of the invention, the photoresist is applied to the workpiece at a thickness of about 15 to about 27 microns.

After spinning the photoresist layer onto the workpiece, the workpiece is allowed to air dry at temperature of about 20° C. to about 60° C., preferably at about ambient temperature, about 25° C. The drying temperature and time allowed for drying is effective for initiating a reaction between a compound of the general formula and the silylating agent. In an important aspect of the invention, the drying time is about 8 to about 24 hours.

The reaction of the compound of the general formula and silylated compound is as follows.

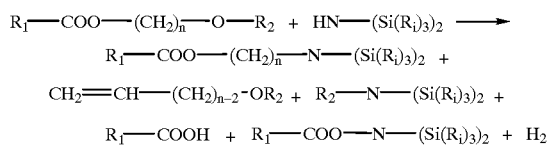

where $R_1$, $R_2$ and $R_3$ are organic radicals having about 1 to about 5 C atoms and n is 2 to18.

Another important aspect of the invention, the process of the invention does not require the use of oxygen plasma as a process for hardening the photoresist. Silyl groups of the composition react slowly with the photoresist composition at high polarity centers in the photoresist chains at room temperature and convert the photoresist into complexes.

In next step of the process of the invention, the coated workpiece is selectively exposed to a radiation source such as ultraviolet light, electron beam, X-ray or the like. Radiation passes through openings in a mask and strikes the photoresist. The photoresist is exposed by the radiation to form exposed areas corresponding to the mask areas. The radiation utilized must have sufficient resolution to form the desired pattern as well as sufficient depth of focus to expose the photoresist throughout its depth to the substrate.

After exposing the photoresist, the substrate may be immersed in a wet chemical develop solution as known in the art, such as tetramethylammonium hydroxide (TMAH), potassium hydroxide, or potassium carbonate. The exposed areas are thus developed and cleared of exposed photoresist.

In the next step of the process of the invention, the workpiece is subjected to dry etching by processes known in the art, such as ECR, RIE, or ICP (Inductive Couple Plasma). In an important aspect of the invention, the high temperature, low pressure conditions encountered during the etching process allow silicon and nitrogen complexes present in the photoresist to react with hydrohalide compounds (HX) to form

where x is a halide ion and $R_j$ is an acetate radical. This complex siliconium ion can intralink with others to form macromolecules. HX includes compositions such as HCl and HBr. In addition, etching conditions also promote the reaction of HX with silicamide to form complex polyimide and polynitride compounds. These types of compounds allow the photoresist to withstand the extreme physical etching conditions of the ECR dry etch technique (high dose of ion bombardment, high temperature and low pressure). Hence, those portions of the workpiece coated with the photoresist composition of the invention are protected during the etching process. The process of the invention provides a selectively etching ratio of about 6:1 to about 11:1. As used herein "selectively etching ratio" means etch rate of InP/etch rate of photoresist. After etching, the photoresist is easily removed with solvents such as acetone and alkaline agents, such as KOH.

The silylated photoresist produced by the process of the invention may be a single sandwich and/or multiple deck sandwich with or without broader or outline configurations.

The following example illustrates the invention and should be understood to be illustrative of, but not limiting upon, the scope of the invention which is defined in the appended claims.

EXAMPLE I 2-ethoxyethylacetate (60%) and n-butyl acetate (5%) were mixed in xylene to provide a photoresist. To this resist was added 0.1 to 5% hexamethyldisilazane. The composition was then applied to inP wafers and processed as described below for FIG. 1 (a, b, c, and d described below correspond to a, b, c and d in FIG. 1.

Figure 2A:
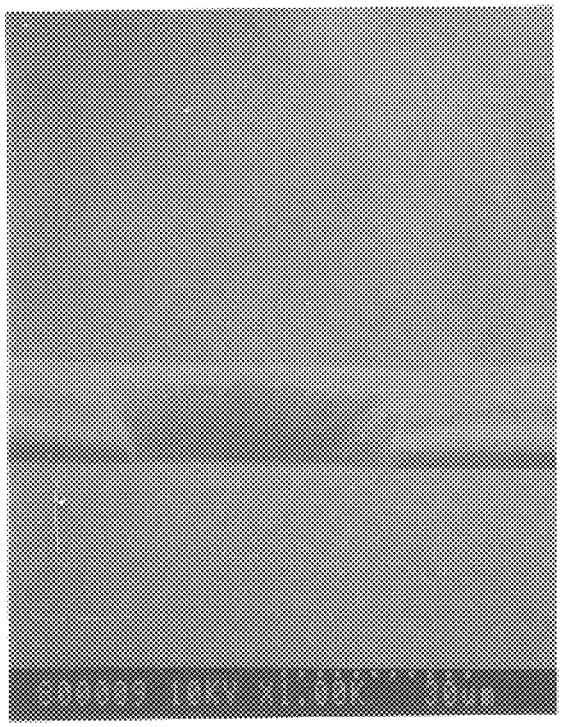
FIG. 2a, FIG. 2b, and FIG. 3 are photomicrographs of InP wafers.

FIG. 2a shows a InP wafer coated with the photoresist of the invention, air dried overnight, soft baked at 90° C. for 45 minutes aligned with mask, exposed at 980 mj/cm$^2$ (UV 350 nm), then developed in AZ400K in deionide water (DI water) (1:4) for 10 minutes, finally baked at 150° C. for 1 hour then ready for ECR etching step.

Figure 2B:
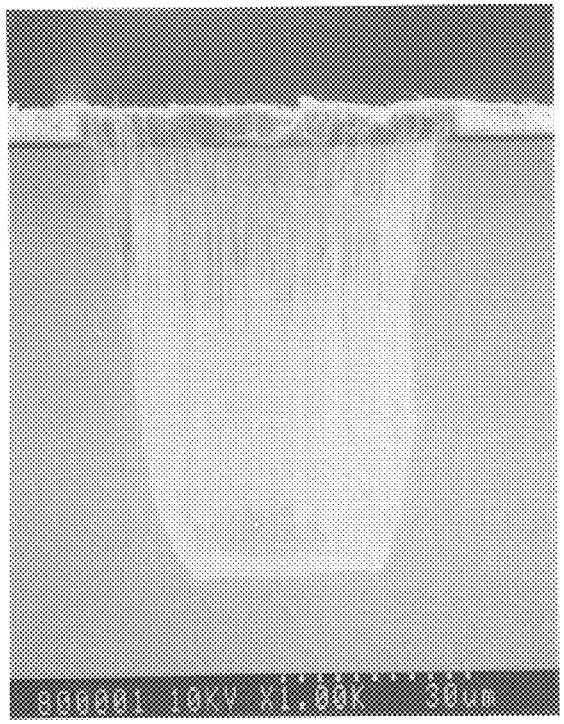
Figure 3:
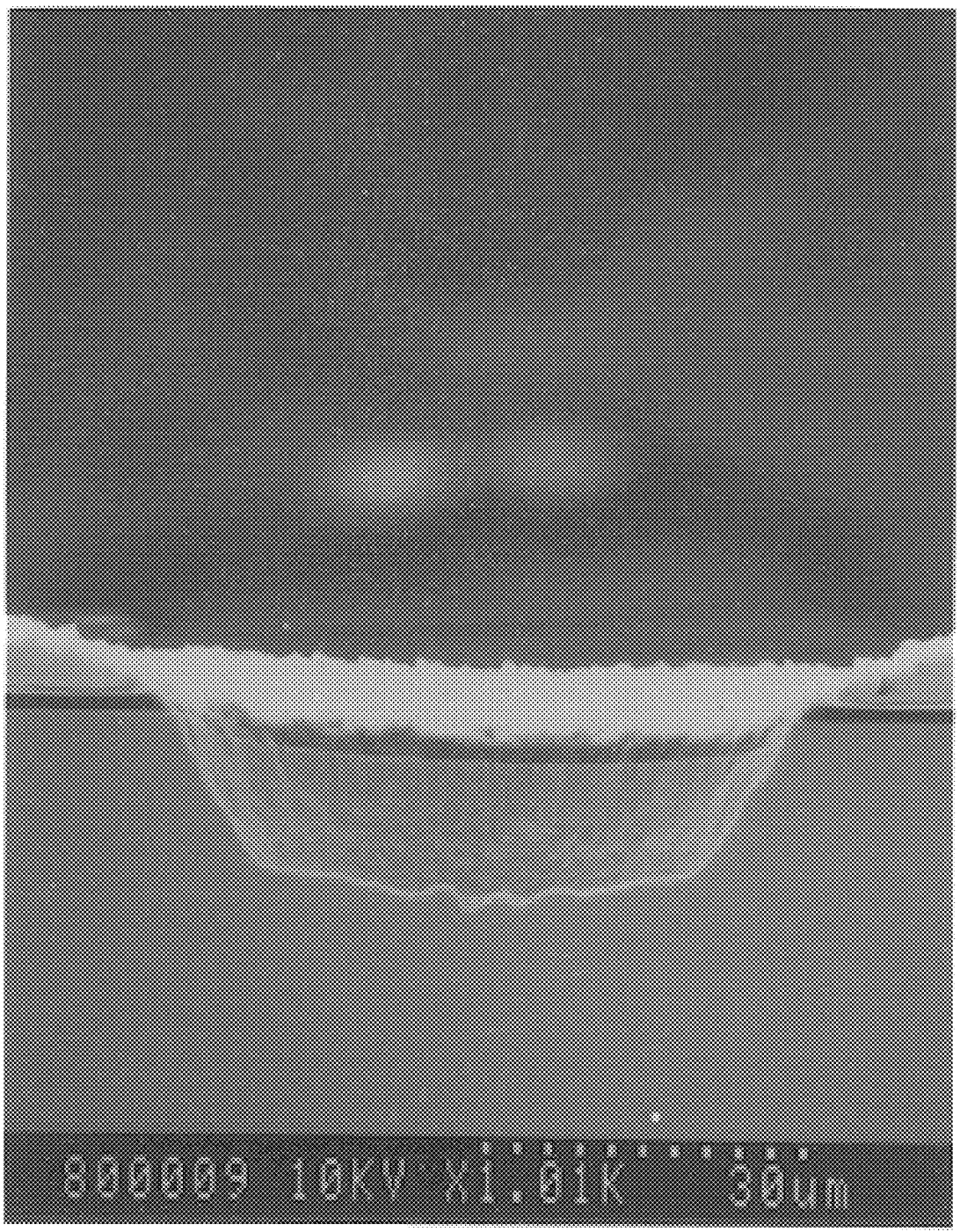

FIGS. 2b and 3 show the wafers after ion etching. FIG. 2b show the sample in FIG. 2a etched in Plasmatherm 700 series with the mixture of gases, argon (5 ccm)+chlorine (8.8 ccm)+hydrogen (26.2 ccm) at pressure 4mT, RF power 450 W, microwave power 1000 W, lower magnetic field current 50 A, temperature 160° C. for 70 minutes. Etching rate 1.07 u/min, selective etching InP/photoresist is 6.5/1 (run 61, 62). Note: Run 59 (not shown), selective etching is 11/1, etch rate 1.04 u/min. Etching conditions: chlorine (10 ccm), hydrogen (25 ccm), Ar (5 ccm), pressure 3.3 mT, temperature 160° C., RF: 400 W, MW: 1000 W, lower Mag 50 A.

FIG. 3 shows the results of etching an InP wafer masked by regular photoresist (not sylilated) AZ4620 at the same etching conditions as sample in FIG. 2b.

A summary of the experiments is shown in Table 1 below. Preparations are as described for FIGS. 2a and 2b above.

Sample (a): Regular Photoresist (AZ4620)

Sample (b): Photoresist sandwiched with photoresist/HMDS

Sample (c): Photoresist sandwiched with photoresist/HMDS

Sample (d): Photoresist sandwiched with photoresist/HMDS

| Sample | Thickness (microns) | UV Exposure (350 nm source) | Developing (min) | Bake (°C.) | Final Thickness (microns) |
|--------|---------------------|-----------------------------|------------------|------------|---------------------------|
| (a) | 21 | 360 mj/cm$^2$ | 5 | 150°/hr | 16.5 |
| (b) | 21 | 600 mj/cm$^2$ | 8 | 150°/hr | 18.5 |
| (c) | 21 | 980 mj/cm$^2$ | 10 | 150°/hr | 16.0 |
| (d) | 21 | 480 mj/cm$^2$ | 5 | 150°/hr | 19.0 |

What is claimed is:

1. A photoresist composition comprising the reaction product of a compound having the general formula $R_1$—COO—$(CH_2)_n$—O—$R_2$, where $R_1$ and $R_2$ are organic radicals having about 1 to about 5 C atoms, and n is 2 to 18; and
    a silylating agent,
      wherein the ratio of the compound of the general formula to the silylating agent is about 99.9:0.1 to about 95:5,
      wherein the photoresist composition is effective for use as an ion etch barrier.

2. The photoresist composition of claim 1 wherein the compound of the general formula is 2-ethoxyethylacetate.

3. The photoresist composition of claim 1 wherein the silylating agent is selected from the group consisting of hexamethyldisilazane (HMDS), heptamethyldisilazane, methyl ethyl siloxane and hexaphenyldisilazanes.

4. The photoresist composition of claim 1 further comprising n-butyl acetate.

* * * * *